United States Patent [19]

Kohmoto

[11] Patent Number: 4,742,385
[45] Date of Patent: May 3, 1988

[54] MULTICHIP PACKAGE HAVING OUTER AND INNER POWER SUPPLY MEANS

[75] Inventor: Mitsuo Kohmoto, Tokyo, Japan
[73] Assignee: NEC Corporation, Tokyo, Japan
[21] Appl. No.: 893,209
[22] Filed: Aug. 5, 1986
[30] Foreign Application Priority Data Aug. 7, 1985 [JP] Japan ........................ 60-120259[U]

[51] Int. Cl.⁴ .......................................... H01L 23/02
[52] U.S. Cl. ...................................... 357/74; 357/75; 357/80; 357/70
[58] Field of Search ....................... 357/75, 80, 74, 70

[56] References Cited

U.S. PATENT DOCUMENTS 4,082,394 4/1978 Gedney et al. ...................... 357/80
4,127,830 11/1978 Chalifour et al. .................... 357/80

FOREIGN PATENT DOCUMENTS 54-132166 10/1979 Japan ................................... 357/70
59-84455 5/1982 Japan ................................... 357/75

OTHER PUBLICATIONS

IBM Technical Disclosure Bulletin, vol. 23, No. 7A, Dec. 1980, pp. 2770-2773.

Primary Examiner—Andrew J. James
Assistant Examiner—Gregory A. Key
Attorney, Agent, or Firm—Burns, Doane, Swecker & Mathis

[57] ABSTRACT

For uniform distribution of power to integrated circuit chips arranged on a substrate, a multichip package comprises a plurality of power feed contact pads on an outer portion of the substrate for coupling to an external power source and a pair of power feed pins on an inner portion of the substrate for coupling to the external power source. A conductive means is provided on the substrate for distributing power from the power feed contact pads and the power feed pins to the integrated circuit chips.

2 Claims, 2 Drawing Sheets

MULTICHIP PACKAGE HAVING OUTER AND INNER POWER SUPPLY MEANS

BACKGROUND OF THE INVENTION

The present invention relates to a high density multichip package, and specifically to a power feed structure therefor.

As typically shown and described in IEEE Transactions on Components, Hybrids, and Manufacturing Technology, Vol. CHMT-6, No. 2, June 1983 entitled "Multilayer Substrates with Thin Film Fine Lines Generated by the Ground Layer Oxidation (GLO) Process" by Akihiro Dohya et al, the recent tendency is toward packaging a plurality of LSI (large scale integration) circuit chips on a single ceramic substrate which is provided with a plurality of contact pads on the outer portion thereof and conductive patterns for coupling the contact pads to the circuit chips. The package is mounted on a printed circuit board which includes an array of connector pins respectively engageable with the contact pads. Some of the connector pins are connected to an external power source while others are connected to an external circuit.

In addition to the tendency toward circuit integration and packaging, needs for high speed signal processing and low level signal transmission have imposed requirements that voltage deviations from circuit to circuit be reduced to a minimum. From this standpoint, the above-mentioned multichip package is not satisfactory. More specifically, since the power supply is provided exclusively from the outer periphery of the substrate there is a voltage difference between the LSI chips in the outer portion of the substrate and those in the inner portion.

SUMMARY OF THE INVENTION

It is therefore an object of the present invention to provide a multichip package which ensures uniform distribution of power to integrated circuit chips.

Specifically, uniform power distribution is achieved by a multichip package comprising a substrate and a plurality of integrated circuit chips mounted on one surface of the substrate. A plurality of power feed contact pads are arranged on an outer portion of the substrate for coupling to an external power source and a plurality of signal feed contact pads are arranged on the outer portion for respectively coupling the chips to an external circuit. A pair of power feed pins are mounted on an inner portion of the substrate for coupling to the external power source. A conductive means is provided for distributing power from the power feed contact pads and the power feed pins to the circuit chips.

In operation, power is uniformly distributed to the integrated circuits from the outer and inner power supply means through the conductive means so that voltage differences which might exist between the chips in the outer portion of the substrate and those in the inner portion are reduced to a minimum.

BRIEF DESCRIPTION OF THE DRAWINGS

The present invention will be described in further detail with reference to the accompanying drawings, in which.

DETAILED DESCRIPTION

Figure 1:
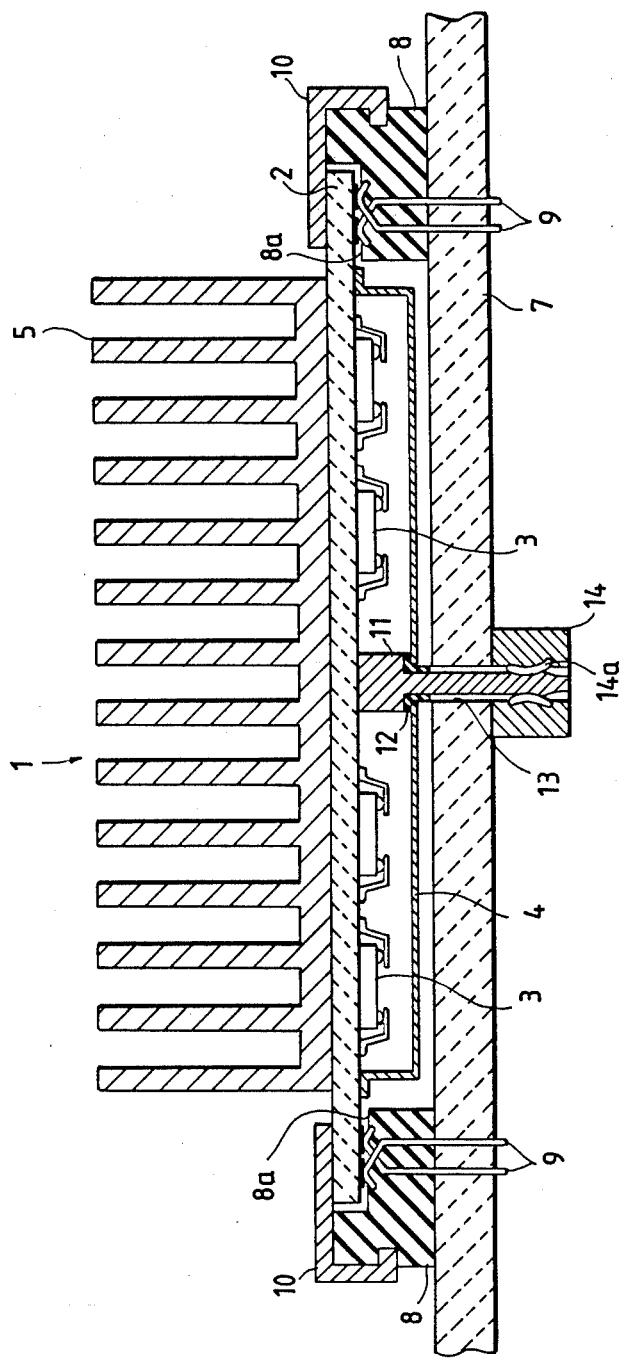
FIG. 1 is a cross-sectional view in elevation of a multichip package of the present invention.
Figure 2:
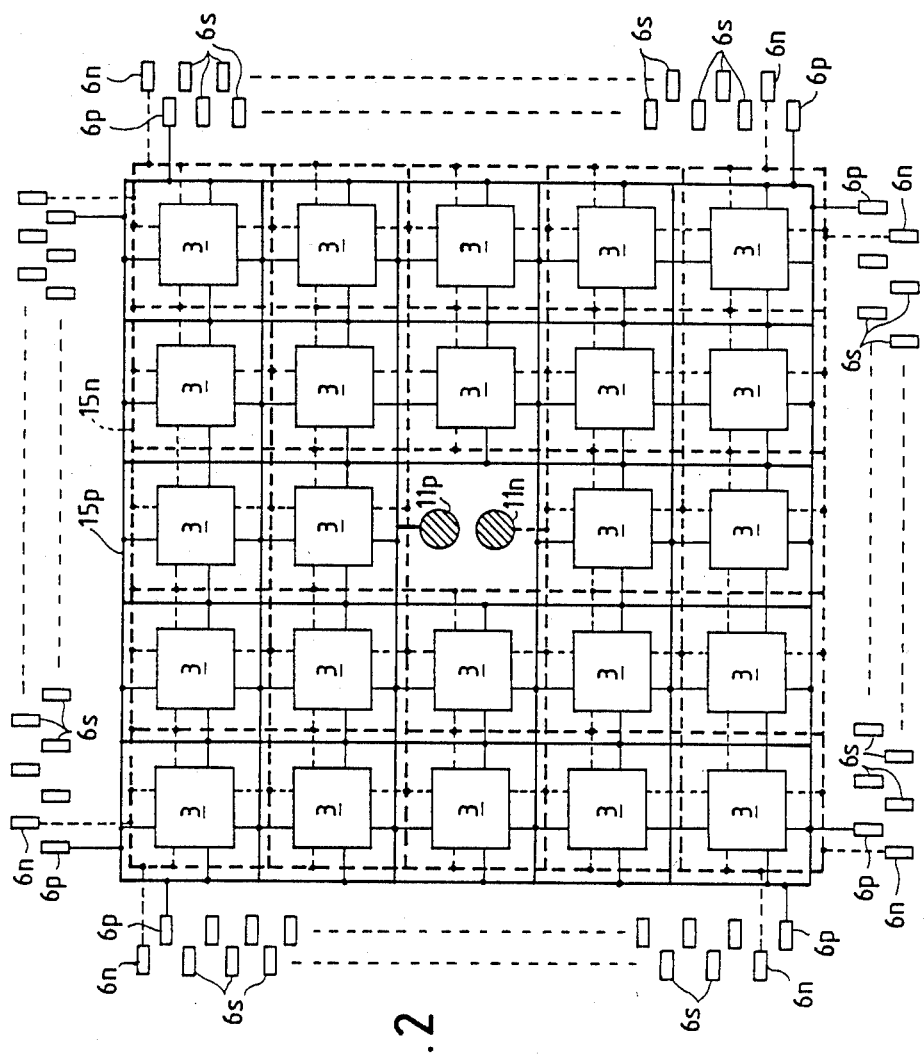
FIG. 2 is a schematic plan view illustrating the schematically illustrating electrical connection of power from outer power feed contact pads and center power feed pins to LSI chips.

As shown in FIGS. 1 and 2, a multichip package 1 according to the present invention comprises an array of LSI (large scale integration) chips 3 which are mounted underside of a ceramic substrate 2 on the upper side of which is a heat sink 5. On the outer edges of ceramic substrate 2 are provided contact pads 6 arranged in outer and inner parallel rows and a metallized grid network of power feed conductors indicated in FIG. 2 by solid lines 15p coupled through contact pads 6p to the positive terminal of a voltage source, not shown, and another metallized grid network indicated by broken lines 15n which is insulated from the other network and coupled through contact pads 6n to the negative terminal of the voltage source in a well known manner. LSI chips 3 receive power from nearby power feed conductor segments of the power feed networks. All integrated circuit chips 3 are covered with a metallic enclosure 4 which serves as an electromagnetic shield. Ceramic substrate 2 is further metallized with a pattern of conductors, not shown, in a known manner for coupling input signals from an external circuit, not shown, to the LSI chips and output signals from the LSI chips to the external circuit through signal feed contact pads 6s.

According to the present invention, multichip package 1 is provided with a pair of power-feed pins 11p and 11n which extend from the center portion of the ceramic substrate downwardly through an opening in the enclosure 4 and are respectively connected to the positive and negative power-feed networks 15p and 15n. Each power-feed pin 11 is fitted with an insulative sleeve 12 to prevent it from being short-circuited with the other power-feed pin by the enclosure 4.

Multichip 1 as constructed in a manner described above is secured in place on a glass epoxy printed-circuit board 7. For this purpose, the printed-circuit board 7 is provided with four elongated blocks 8 arranged in square. Each block 8 has a stepped portion 8a to support the ceramic substrate 2 and a holding member 10 for securing the substrate 2 in position. Connector pins 9 extend vertically through circuit board 7 and block 8 to the surface of the stepped portion 8a and are horizontally arranged in outer and inner rows. The upper portions of outer row connector pins 9 are bent inwards to establish pressure contact with inner row contact pads 6 and the upper portions of inner row connector pins 9 are bent outwards to establish pressure contact with outer row contact pads 6 when the multichip package 1 is held in place on the circuit board 7. Some of the connector pins 9 engage with the power feed contact pads 6p and 6n, while others engage with signal feed contact pads 6s. Circuit board 7 is formed with a pair of holes 13 and provided with a pair of sockets 14 aligned with the holes 13, each of the sockets having leaf springs 14a therein.

Power feed pins 11p and 11n extends through the holes 13 and engage with the leaf springs 14a of the sockets for connection to the positive and negative terminals of the external voltage source, respectively.

As can be seen from FIG. 2, the center feed pins 11p and 11n each have a cross-sectional area much larger than the cross-sectional area of each connector pin 9 and supply power to the inner portion of the grid networks while the power feed contact pads 6p and 6n supply power to the outer portion of the grid networks. Thus, potential differences which might otherwise occur between the chips in the outer area of the ceramic substrate and those in the inner area can be reduced to a minimum.

What is claimed is:

1. A multichip package comprising:
   a substrate;
   a plurality of integrated circuit chips mounted on one surface of said substrate;
   a plurality of power feed contact pads arranged on an outer portion of said substrate for coupling to an external power source;
   a plurality of signal feed contact pads arranged on said outer portion and respectively coupled to said chips for coupling to an external circuit;
   a pair of power feed pins mounted on the center portion of the area of said substrate for coupling to said external power source; and
   conductive means for uniformly distributing power from said power feed contact pads and said power feed pins to said integrated circuit chips.

2. A multichip package comprising:
   a substrate;
   a plurality of integrated circuit chips mounted on one surface of said substrate;
   a plurality of power feed contact pads arranged on an outer portion of said substrate and a plurality of signal feed contact pads arranged on said outer portion and respectively coupled to said chips;
   a pair of power feed pins mounted on the center portion of the area of said substrate;
   conductive means for uniformly distributing power from said power feed contact pads and said power feed pins to said integrated circuit chips;
   a circuit board;
   means for securing said substrate on said circuit board;
   a plurality of power feed connectors on said circuit board respectively engageable with said power feed contact pads for coupling power from an external power source to said power feed contact pads and a plurality of signal feed connectors on said circuit board respectively engageable with said signal feed contact pads for coupling an external circuit to said chips; and
   a pair of sockets on said circuit board engageable respectively with said power feed pins for coupling power from said external source to said power feed pins.

* * * * *